(12) United States Patent
Hwang

(10) Patent No.: US 10,877,883 B2
(45) Date of Patent: Dec. 29, 2020

(54) MEMORY SYSTEM, CONTROLLER FOR PERFORMING READ RECLAIM OPERATION, AND METHOD FOR OPERATING THE CONTROLLER

(71) Applicant: SK hynix Inc., Gyeonggi-do (KR)

(72) Inventor: Ji-Hoon Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 37 days.

(21) Appl. No.: 16/217,311

(22) Filed: Dec. 12, 2018

(65) Prior Publication Data

US 2019/0361806 A1 Nov. 28, 2019

(30) Foreign Application Priority Data

May 23, 2018 (KR) ........................ 10-2018-0058480

(51) Int. Cl.
| | | |
|---|---|---|
| *G06F 12/02* | (2006.01) | |
| *G06F 12/0882* | (2016.01) | |
| *G11C 16/26* | (2006.01) | |
| *G11C 29/42* | (2006.01) | |
| *G11C 29/52* | (2006.01) | |
| *G11C 16/34* | (2006.01) | |

(52) U.S. Cl.
CPC ...... *G06F 12/0261* (2013.01); *G06F 12/0882* (2013.01); *G11C 16/26* (2013.01); *G11C 16/349* (2013.01); *G11C 29/42* (2013.01); *G11C 29/52* (2013.01); *G06F 2212/7205* (2013.01)

(58) Field of Classification Search
CPC ............. G06F 12/0261; G06F 12/0882; G06F 2212/7205; G11C 16/26; G11C 16/349; G11C 29/42; G11C 29/52
See application file for complete search history.

(56) References Cited

U.S. PATENT DOCUMENTS

2016/0372208 A1* 12/2016 Cai .................... G11C 16/3431

FOREIGN PATENT DOCUMENTS

| KR | 1020160099218 | 8/2015 |
|---|---|---|
| KR | 1020170095524 | 8/2017 |

* cited by examiner

*Primary Examiner* — Larry T Mackall
(74) *Attorney, Agent, or Firm* — IP & T Group LLP

(57) ABSTRACT

A method for operating a controller that controls a memory device including a memory block formed of a plurality of pages: calculating a read disturbance count for each of neighboring pages of a target page in the memory block based on the number of times that a test read operation is performed on the target page; calculating a read count for each of the neighboring pages based on the read disturbance count during a read operation on the target page; and determining whether to perform a read reclaim operation based on the read counts of the pages in the memory block.

13 Claims, 12 Drawing Sheets

| | |
|---|---|
| log(threshold read count) | 1.5 |
| threshold read count | 32 |
| trigger count | 250000 |
| read disturb value | 7906 |
| weak area | Yes |

| | |
|---|---|
| log(threshold read count) | 6 |
| threshold read count | 1000000 |
| trigger count | 250000 |
| read disturb value | 0.25 |
| weak area | |

MEMORY SYSTEM, CONTROLLER FOR PERFORMING READ RECLAIM OPERATION, AND METHOD FOR OPERATING THE CONTROLLER

CROSS-REFERENCE TO RELATED APPLICATION(S)

The present application claims priority of Korean Patent Application No. 10-2018-0058480, filed on May 23, 2018, which is incorporated herein by reference in its entirety.

BACKGROUND

1. Field

Various exemplary embodiments of the present invention generally relate to a memory system. Particularly, the embodiments relate to a memory system, a controller, and a method for operating the memory system and the controller.

2. Description of the Related Art

The computer environment paradigm has recently been shifting towards ubiquitous computing, which enables computing systems to be used anytime and anywhere. As a result, use of portable electronic devices such as mobile phones, digital cameras, and notebook/laptop computers has rapidly increased. These portable electronic devices generally use a memory system having one or more memory devices for storing data. A memory system in such device may be used as a main memory device or an auxiliary memory device.

Such memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Embodiments of the present invention are directed to a controller that may improve performance and reliability of a memory system by performing a read reclaim operation with a state of a memory device reflected, and a method for operating the controller.

In accordance with an embodiment of the present invention, a method for operating a controller that controls a memory device including a memory block formed of a plurality of pages includes: calculating a read disturbance count for each of neighboring pages of a target page in the memory block based on the number of times that a test read operation is performed on the target page; calculating a read count for each of the neighboring pages based on the read disturbance count during a read operation on the target page; and determining whether to perform a read reclaim operation based on the read counts of the pages in the memory block.

In accordance with another embodiment of the present invention, a controller for controlling a memory device that includes a memory block formed of a plurality of pages includes: a test component suitable for calculating a read disturbance count for each of neighboring pages of a target page in the memory block based on the number of times that a test read operation is performed on the target page; a calculation component suitable for calculating a read count for each of the neighboring pages based on the read disturbance count during a read operation to the target page; and a determination component suitable for determining whether to perform a read reclaim operation based on the read counts of the pages in the memory block.

In accordance with yet another embodiment of the present invention, a method for operating a memory system includes: performing a read operation on a target page of a target memory block; calculating a current read count by adding a read disturbance count according to a page offset from the target page to a preceding read count of each of neighboring pages of the target page; and performing a read reclaim operation on the target memory block based on a current read count of pages included in the target memory block.

In accordance with still another embodiment of the present invention, a memory system includes: a memory device including a plurality of memory blocks; and a controller suitable for controlling the memory device to perform a read operation on a target page in a target memory block; calculating a current read count by adding a read disturbance count according to a page offset from the target page to a previous read count of each of neighboring pages of the target page; and controlling the memory device to perform a read reclaim operation on the target memory block based on the current read count of pages included in the target memory block.

The read disturbance count according to the page offset may be calculated by dividing a trigger count by the threshold read count for each of neighboring pages of a test target page so as to produce a resultant value and multiplying the resultant value by a default increment.

The threshold read count may be a test read count of the test target page when a bit error rate reaches a threshold bit error rate in each of the neighboring pages of the test target page.

The trigger count may be a reference read count for performing a read reclaim operation.

In accordance with still another embodiment of the present invention, a memory system includes: a memory device having a memory block including a plurality of pages; a controller suitable for: controlling the memory device to perform a read operation on a target page in the memory block; obtaining read disturbance counts of respective neighboring pages of the target page based on a table having a relationship between the read disturbance count and a page offset in the memory block; obtaining read counts of the neighboring pages by accumulating the read disturbance counts to the read counts of the neighboring pages; and controlling the memory device to perform a read reclaim operation to the memory block based on read counts of the pages in the memory block, wherein the table is predetermined through repeated test read operations on a reference page in the memory block, and wherein the read disturbance count in the table is obtained by dividing a read reclaim trigger count of the memory block by a threshold read count of a page having the page offset from the reference page in the memory block.

DETAILED DESCRIPTION

Figure 1:
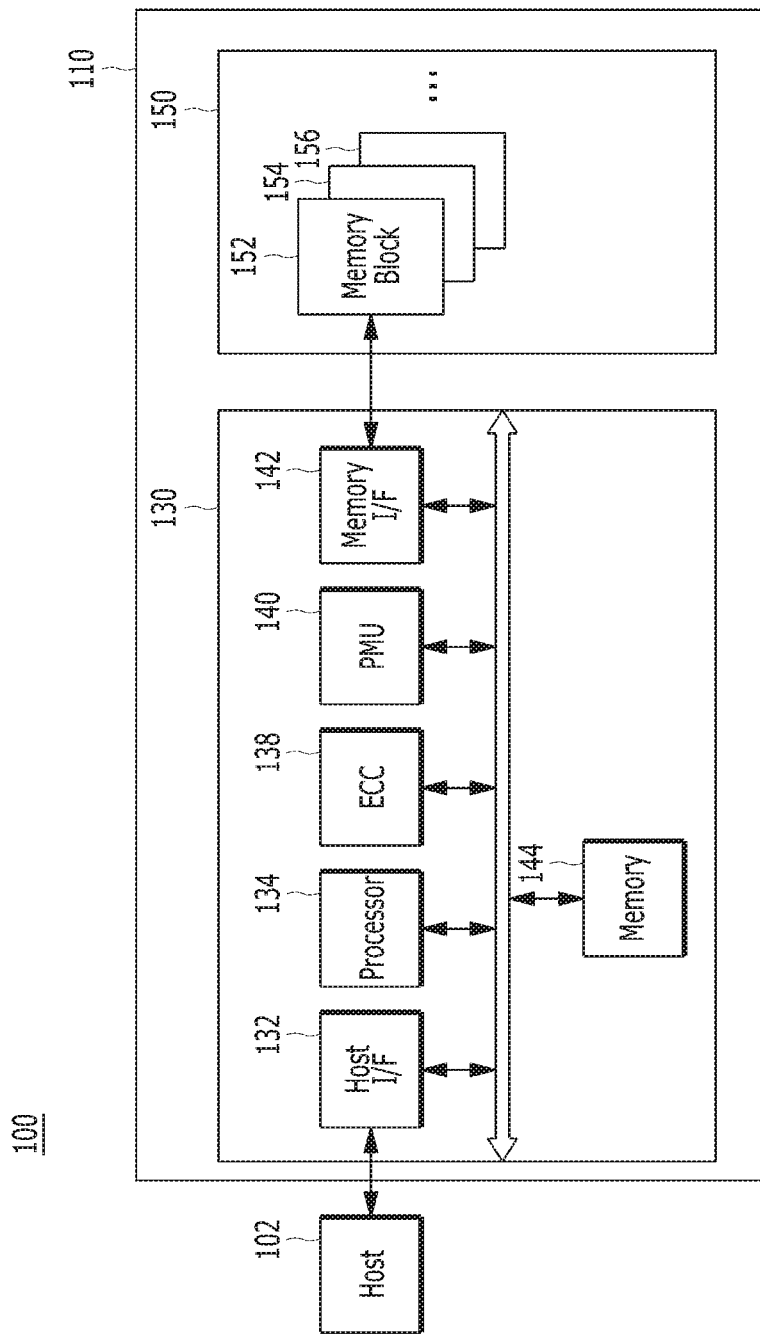
FIG. 1 is a block diagram illustrating a data processing system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

As used herein, singular forms may include the plural forms as well and vice versa, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is noted that reference to "an embodiment" does not necessarily mean only one embodiment, and different references to "an embodiment" are not necessarily to the same embodiment(s).

Hereinafter, the various embodiments of the present invention will be described in detail with reference to the attached drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, game machine, TV, and projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a is digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . (hereinafter, referred to as "memory blocks 152 to 156") each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (DATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation for the memory device 150 through the processor 134, which is realized as a microprocessor or a CPU. The background operation performed on the memory device 150 may include an operation of copying and processing data stored in some memory blocks among the memory blocks 152 to 156 of the memory device 150 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
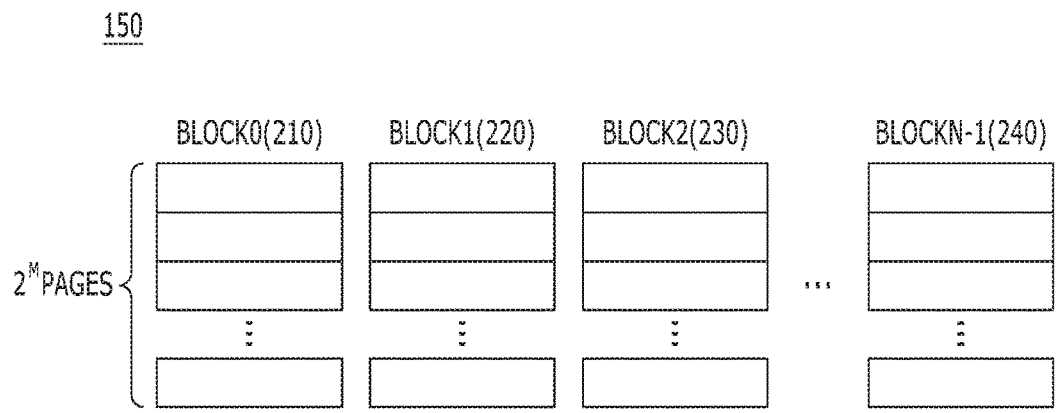
FIG. 2 is a schematic diagram illustrating an exemplary configuration of a memory device employed in a memory system of FIG. 1.
Figure 3:
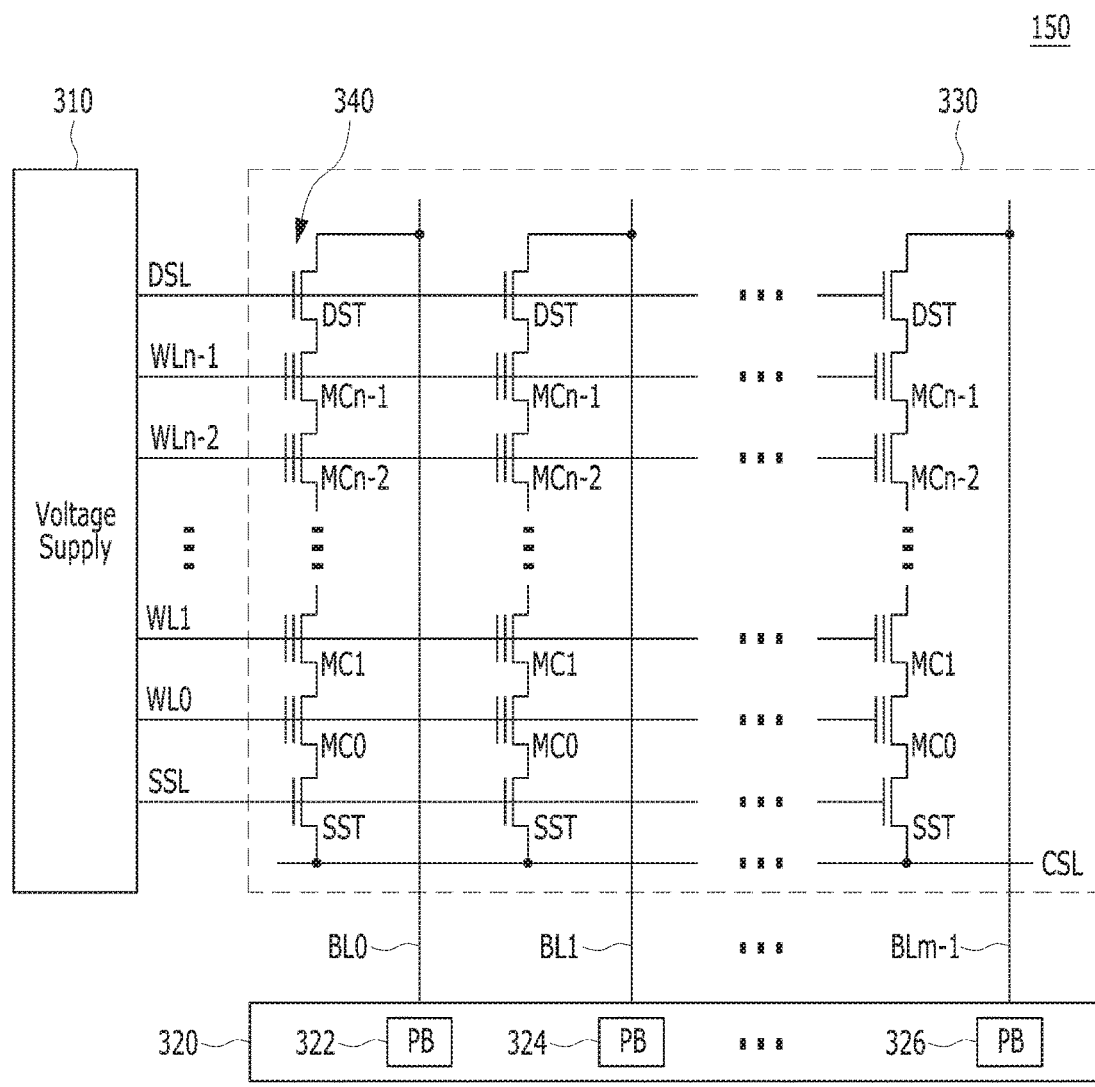
FIG. 3 is a circuit diagram illustrating an exemplary configuration of a memory cell array of a memory block in a memory device shown in FIG. 1.
Figure 4:
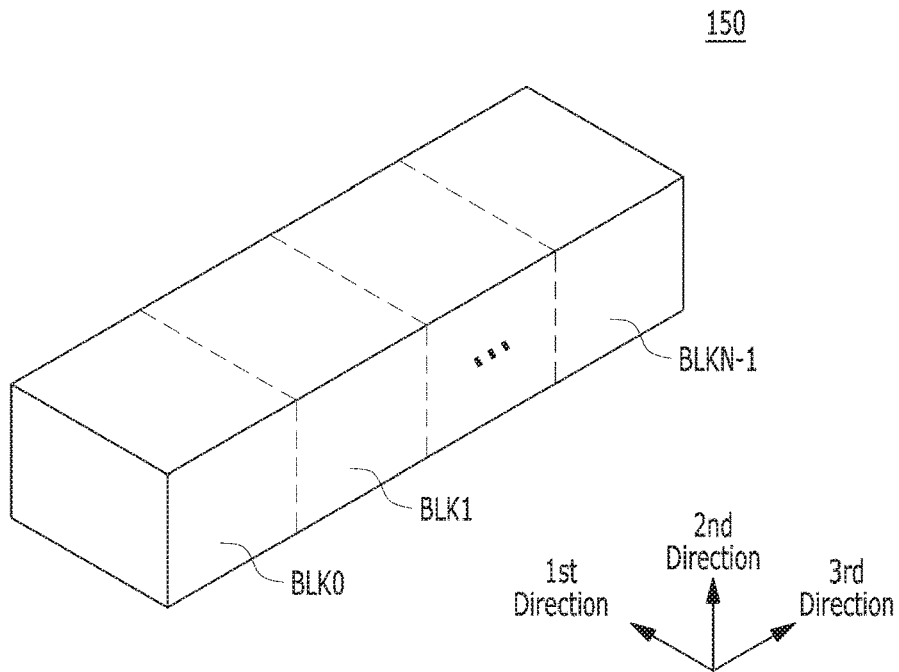
FIG. 4 is a schematic diagram illustrating an exemplary three-dimensional (3D) structure of the memory device of FIG. 2.

FIG. 2 is a schematic diagram illustrating the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks 0 to N−1, e.g., a memory block 0 BLOCK0 (210), a memory block 1 BLOCK1 (220), a memory block 2 BLOCK2 (230), and a memory block N−1 BLOCKN−1 (240). Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. However, it is to be noted that the memory device 150 may include not only the MLC memory blocks, each of which includes a plurality of pages that are realized by memory cells capable of storing two-bit data in one memory cell, but may also include triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks 210, 220, 230 and 240 may store the data transferred from the host 102 through a program operation, and transfer data stored therein to the host 102 through a read operation.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. The plurality of memory blocks BLK0 to BLKN−1 may correspond to the memory blocks 210 to 240 shown in FIG. 2 and may correspond to the memory blocks 152 to 156 shown in FIG. 1. FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may be a three-dimensional structure with dimensions extending in first to third directions, e.g., an x-axis direction, a y-axis direction, and a z-axis direction, respectively.

Each memory block 330 included in the memory device 150 may include a plurality of NAND strings NS that are extended in the second direction, and a plurality of NAND strings NS that are extended in the first direction and the third direction. Each of the NAND strings NS may be coupled to a bit line BL, at least one string select line SSL, at least one ground select line (not shown), a plurality of word lines WL, at least one dummy word line (not shown), and a common source line CSL, and each of the NAND strings NS may include a plurality of transistor structures (not shown).

In short, each memory block 330 among the memory blocks 152 to 156 of the memory device 150 may be coupled to a plurality of bit lines BL, a plurality of string select lines SSL, a plurality of ground select lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string select transistor SST of each NAND string NS may be coupled to a corresponding bit line BL, and a ground select transistor GST of each NAND string NS may be coupled to a common source line CSL. Memory cells MC may be provided between the string select transistor SST and the ground select transistor GST of each NAND string NS. In other words, a plurality of memory cells may be realized in each memory block 330 of the memory blocks 152 to 156 of the memory device 150. A data processing operation for a memory device, particularly, a data processing operation performed when a plurality of command operations corresponding to a plurality of commands are performed, in a memory system in accordance with an embodiment of the present invention, is described in detail with reference to FIGS. 5 to 9.

Figure 5:
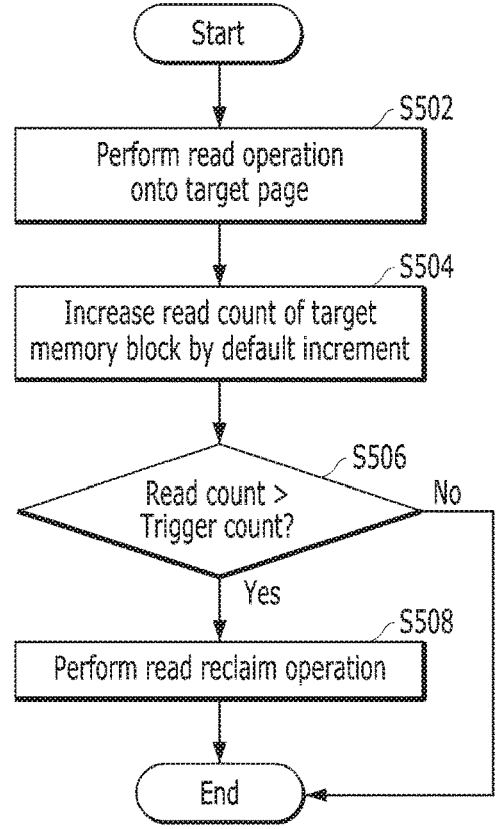
FIG. 5 is a flowchart exemplarily describing an operation performed according to a read command of a memory system.

FIG. 5 is a flowchart exemplarily describing an operation performed according to a read command of the memory system 110.

In step S502, when the controller 130 receives a read command from the host 102 to read data from a target page of a target memory block, the controller 130 may control the memory device 150 to read data from the target page of the target memory block in response to the read command from the host 102.

In step S504, the controller 130 may increase a read count of the target memory block by a default increment, for example, an increment of '1'.

In step S506, the controller 130 may check out whether the read count exceeds a predetermined threshold value or not. When the read count exceeds the predetermined threshold value ("Yes" in the step S506), the controller 130 may perform a read reclaim operation on the target memory block in step S508. When the read count does not exceed the predetermined threshold value ("No" in the step S506), the controller 130 may end the read operation according to the read command. In the present patent specification, the predetermined threshold value that triggers the read reclaim operation may be defined as 'a trigger count'.

Meanwhile, the read disturbance phenomenon may not occur evenly in all the memory cells of the target memory block. For example, the read disturbance phenomenon may occur in a memory cell belonging to a page which is disposed adjacent to the target page. Also, each memory block may experience the read disturbance phenomenon differently, and the effect of the read disturbance phenomenon to each memory block may vary according to the temperature of the memory device.

According to the prior art, as described above, the read reclaim operation may be uniformly performed based on the read count, even though the effect of the read disturbance phenomenon to each memory block is different. That is, according to the prior art, a problem may occur in which the read reclaim operation is performed with no consideration of the influence of the read disturbance phenomenon which is different for each memory block. This problem may reduce the performance and reliability of the memory system 110.

According to an embodiment of the present invention, a read reclaim operation may be performed according to the current read count which is calculated by accumulating the read disturbance count. The influence of the read disturbance phenomenon on a memory cell belonging to a neighboring page of the target page of the read operation may be reflected into the read disturbance count. Whenever a read operation is performed, the read disturbance count may be added to the previous read count for each page of the target memory block to calculate the current read count, and a read reclaim operation may be performed according to the current read count. The read disturbance count may improve the performance and reliability of the memory system 110.

Figure 6A:
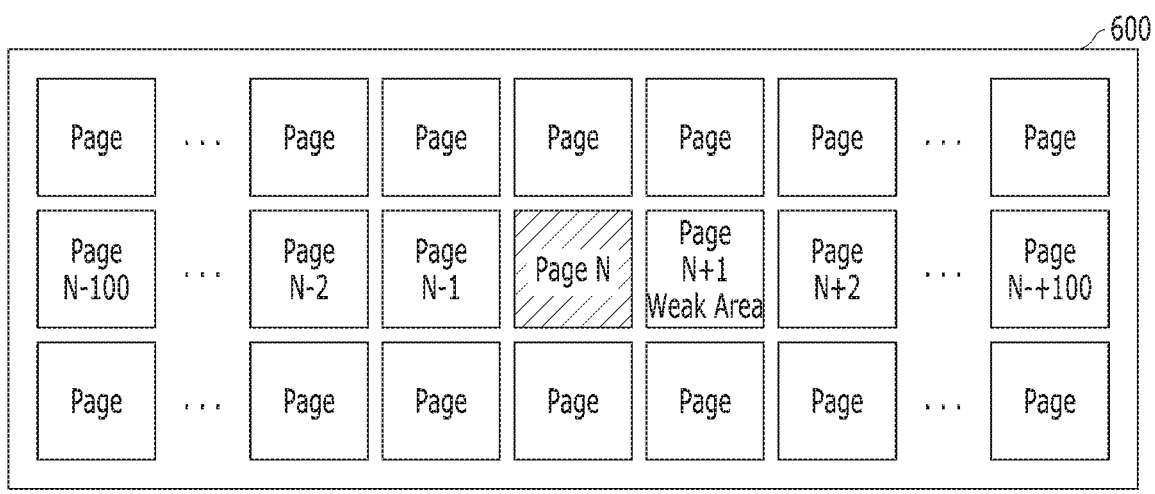
FIGS. 6A to 6C illustrate a read disturbance count in accordance with an embodiment of the present invention.
Figure 6B:
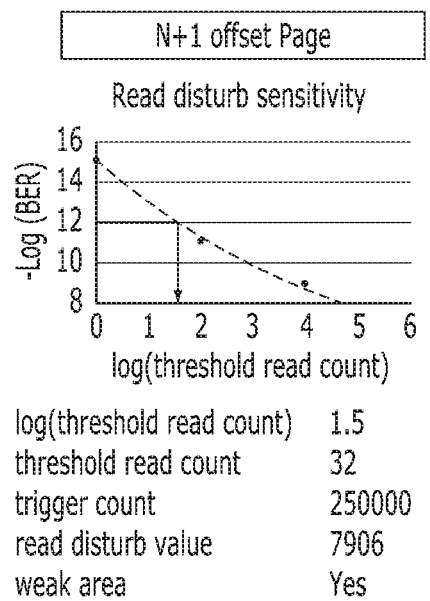
Figure 6C:
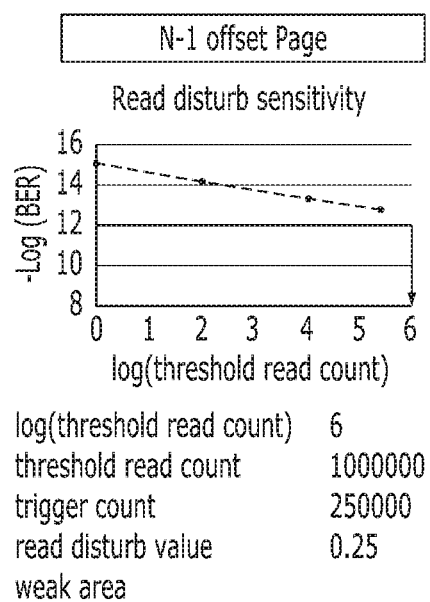

FIGS. 6A to 6C illustrate a read disturbance count in accordance with an embodiment of the present invention.

The concept of the read disturbance count will be described by taking as an example a case where a read operation is repeatedly performed on a target page Page N of a memory block 600 shown in FIG. 6A. The memory block 600 may correspond to one among the memory blocks 152, 154 and 156 of FIG. 1.

A bit error rate (BER) corresponding to a threshold point at which an error of a read data is not correctable even by error correction decoding (i.e., uncorrectable ECC error or a UECC error) may be defined as a "threshold bit error rate". When a read operation is repeatedly performed on the target page Page N, the bit error rate for the data of the neighboring page may be gradually increased. Herein, the read count of the target page Page N when the bit error rate for the data of the neighboring page reaches the threshold bit error rate may be defined as a "threshold read count of the neighboring page". The threshold read count of a neighboring page disposed nearer from the target page Page N may be less than the threshold read count of a neighboring page disposed farther from the target page Page N. That is, the threshold read count of a neighboring page may become lesser as the neighboring page is disposed farther from the target page Page N.

Referring to FIG. 6B, a method for calculating the read disturbance count is described.

The graph of FIG. 6B illustrates a bit error rate of a page Page N+1 disposed next to the target page Page N when the read operation is repeatedly performed on the target page Page N. Referring to FIG. 6B, the threshold bit error rate may be $10^{-12}$. When the target page Page N is read 32 times, the bit error rate of the next page Page N+1 may reach the threshold bit error rate. In this case, the threshold read count of the neighboring page Page N+1 may be 32.

Meanwhile, the trigger count of the memory block 600 may be, for example, 250K. The value obtained by dividing the trigger count (i.e., 250K) by the threshold read count (i.e., 32) is approximately 7906. In other words, when the target page Page N is read once, the next page Page N+1 may be affected by the disturbance to the same extent when the memory block 600 is read 7906 times. The value obtained by dividing the trigger count by the is threshold read count may be defined as a "read disturbance value". The read disturbance count of the next page Page N+1 may be set, for example, to 7906 by multiplying the read disturbance value (i.e., 7096) by the default increment, e.g., an increment of '1'.

The graph of FIG. 6C illustrates the bit error rate of a page Page N−1 previous to the target page Page N when a read operation is repeatedly performed on the target page Page N. Referring to FIG. 6C, when the target page Page N is read 1M, the bit error rate of the previous page Page N−1 may reach the threshold bit error rate. In this case, the threshold read count of the neighboring page may be 1M.

When the trigger count of the memory block 600 is 250K, the read disturbance value obtained by dividing the trigger count (i.e., 250K) by the threshold read count (i.e., 1M) is 0.25. The read disturbance count of the previous page Page N−1 may be set to, for example, 0.25 by multiplying the read disturbance value (i.e., 0.25) by the default increment.

As described above, the trigger count for performing a read reclaim operation in the memory system 110 may be predetermined. For each of the neighboring pages of the target page, the read disturbance count may be calculated by dividing the trigger count by the threshold read count and multiplying the resultant value (i.e., the read disturbance value) by the default increment. The read disturbance value of a neighboring page may become less as the neighboring page is disposed farther from the target page Page N.

Meanwhile, according to the above example, the read disturbance count of the next page Page N+1 is 7906, which is particularly high. When a read operation is performed on the target page Page N, it may be regarded that the next page Page N+1 is particularly affected by read disturbance. A page having the read disturbance count greater than or equal to a predetermined threshold value may be designated as a weak area.

When it is assumed that the influence on a neighboring page of any target page of a read operation is constant in the memory block 600, it may be regarded that the read disturbance count corresponding to a predetermined page offset may be constant. Once a table having a relationship between the read disturbance count and a page offset in the memory block 600 is predetermined, the read disturbance count of any neighboring page in the memory block 600 may be obtained based on the table when a read operation is performed on any target page in the memory block 600. In the table, the page offset may serve as a page offset with reference to a particular target page when a read operation is performed to the particular target page.

Figure 7:
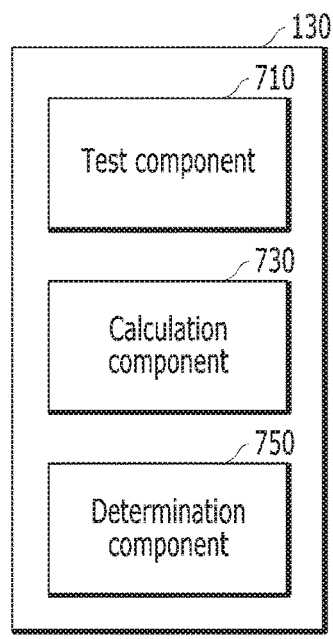
FIG. 7 is a block diagram illustrating a structure of a controller in accordance with an embodiment of the present invention.

FIG. 7 is a block diagram illustrating a structure of the controller 130 in accordance with an embodiment of the present invention.

Referring to FIG. 7, in addition to the components already described in FIG. 1, the controller 130 may include a test component 710, a calculation component 730, and a determination component 750.

According to the embodiment of the present invention, each of the test component 710, the calculation component 730, and the determination component 750 may correspond to the processor 144 of the controller 130 of FIG. 1.

The test component 710 may calculate a read disturbance count for each of neighboring pages of a test target page based on a number of times that a test read operation is performed on the test target page of a memory block. Through the test read operation, the table having the relationship between the read disturbance count and a page offset in the memory block may be obtained. The operation of the test component 710 will be described in detail with reference to FIG. 8.

The calculation component 730 may calculate the read count for each of neighboring pages of a target page of a read operation based on the table having the relationship between the read disturbance count and a page offset in the memory block whenever the read operation is performed. For each of the neighboring pages whenever the read operation is performed, the read disturbance count may be added to the previous read count to calculate a current read count. The read disturbance count of the neighboring pages in the memory block may be obtained based on the table when the read operation is performed on the target page in the memory block. In this case, the page offset of the table may serve as a page offset with reference to the target page in the memory block.

The determination component 750 may determine whether to perform a read reclaim operation on the memory block based on the read counts of pages included in the memory block.

Figure 8:
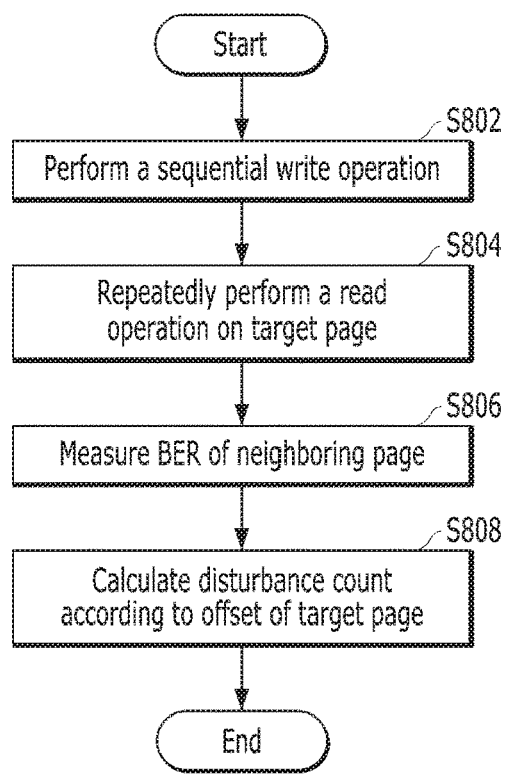
FIG. 8 is a flowchart describing a method for calculating a disturb count in accordance with an embodiment of the present invention.

FIG. 8 is a flowchart describing a method for calculating a read disturbance count of each neighboring page in accordance with an embodiment of the present invention.

In step S802, the test component 710 may control the memory device 150 to perform a sequential write operation on all the pages of a target memory block. As a result, the state of the target memory block may be brought back to the state before the read disturbance phenomenon occurs.

In step S804, the test component 710 may control the memory device 150 to repeatedly perform a read operation on the test target page of the target memory block. Meanwhile, the test component 710 may count the number of times that the test read operation is performed on the target page.

In step S806, the test component 710 may measure the bit error rate of each of the neighboring pages of the target page in the target memory block.

According to an embodiment of the present invention, the test component 710 may measure the bit error rate of each of the neighboring pages whenever the test read operation is performed on the target page, or the test component 710 may measure the bit error rate only at a particular number of times when the test read operation is performed.

In step S808, the test component 710 may calculate the read disturbance count of each of the neighboring pages to calculate a read disturbance count according to a page offset from the target page. Based on the read disturbance count of each of the neighboring pages having the page offset from the target page, the table having a relationship between the read disturbance count and the page offset in the target memory block may be obtained.

According to an embodiment of the present invention, the read disturbance count may be calculated by calculating a threshold read count at which the bit error rate of the neighboring page reaches a threshold bit error rate as described with reference to FIGS. 6A to 6C and multiplying a read disturbance value, which is obtained by dividing the trigger count by the threshold read count, by a default increment.

According to an embodiment of the present invention, the threshold read count may be calculated by measuring the bit error rate of each of the neighboring pages only at a particular number of times when a test read operation is performed on the target page and deriving an expression showing a relationship between the number of times that the test read operation is performed and the bit error rate based on the measured bit error rate. For example, the expression showing the relationship may be derived from a linear regression equation in which log(threshold read count) is an independent variable and −log(BER) is a dependent variable. In this case, since the bit error rates of the neighboring pages are not required to be measured for each number of times that a read operation is performed, the threshold read count may be efficiently calculated.

According to an embodiment of the present invention, the table having a relationship between the read disturbance count and a page offset may be calculated for each memory block, and the read disturbance count may be obtained when a read count according to a read operation in a memory block in the future is calculated.

According to an embodiment of the present invention, the table having a relationship between the read disturbance count and a page offset may be calculated for each memory block group including a plurality of memory blocks, and when the read count according to the read operation in the future is calculated in each memory block group, the table having a relationship between the read disturbance count and a page offset may be applied to each memory block group.

According to an embodiment of the present invention, a read disturbance count may be set to a value obtained by assigning a predetermined weight to the read disturbance value, which is calculated by the method described with reference to FIGS. 6A to 6C and FIG. 8.

For example, when the temperature of the memory device 150 is high while the read operation is performed, the influence of the read disturbance phenomenon may become greater. Therefore, according to an embodiment of the present invention, when the temperature of the memory device 150 is high while the read operation is performed, a value obtained by multiplying the calculated read disturbance value by a predetermined first weight corresponding to the temperature may be set as a read disturbance count.

According to an embodiment of the present invention, as for the weak area described with reference to FIG. 6, a value obtained by multiplying the calculated read disturbance value by a predetermined second weight may be set as a read disturbance count.

The table having a relationship between the read disturbance count and a page offset may be applied according to the offset from the target page in a read operation to be performed on an arbitrary target page in the future.

Figure 9:
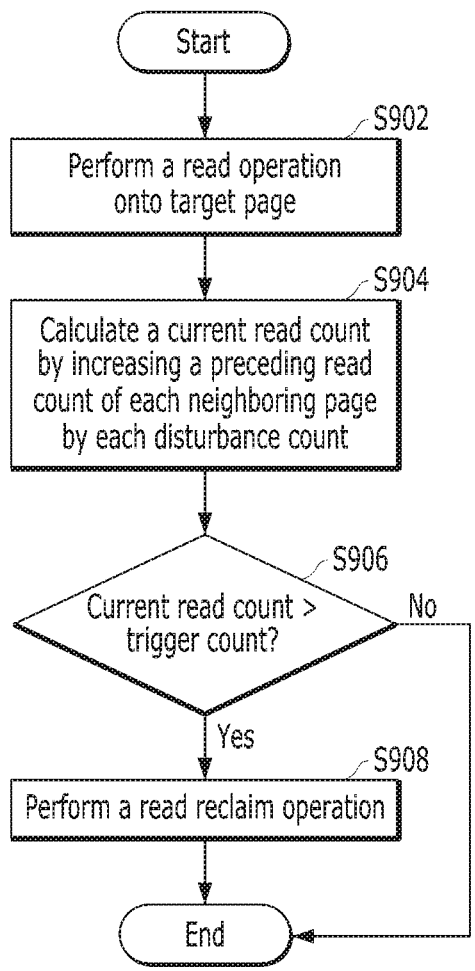
FIG. 9 is a flowchart describing an operation performed according to a read command in a memory system in accordance with an embodiment of the present invention.

FIG. 9 is a flowchart describing an operation performed according to a read command in the memory system 110 in accordance with an embodiment of the present invention.

In step S902, the controller 130 may control the memory device 150 to perform a read operation on a target page of a target memory block in response to a command transferred from the host 102.

In step S904, the calculation component 730 may calculate the current read count of each of neighboring pages by adding the read disturbance count according to the offset from the target page to the previous read count of each of the neighboring pages of the current target page, which is described with reference to FIG. 7. The read disturbance count of the neighboring pages in the target memory block may be obtained based on the table when the read operation is performed on the target page in the target memory block. In this case, the page offset of the table may serve as a page offset with reference to the target page in the target memory block.

In step S906, the determination component 750 may determine whether the current read count of each of the pages of the memory block exceeds a predetermined threshold value (i.e., trigger count) or not.

If any of the current read counts exceeds the trigger count ("Yes" in the step S906), the controller 130 may perform a read reclaim operation on the target memory block.

According to one embodiment of the present invention, the read reclaim operation may include reading data of the memory block and storing the read data in another memory block.

According to an embodiment of the present invention, the read reclaim operation may further include correcting an error of the read data.

If all of the current read counts do not exceed the trigger count ("No" in the step S908), the controller 130 may end the operation according to the read command.

According to the embodiment of the present invention, the current read count may be calculated by adding a read disturbance count, which accurately reflects the extent of influence of the read disturbance phenomenon on each page of the memory block, to the previous read count, and a read reclaim operation may be performed based on the current read count. Therefore, since the read reclaim operation is performed in a timely manner, the performance and reliability of the memory system 110 may be improved.

Hereafter, referring to FIGS. 10 to 18, a data processing system and electronic devices to which the memory system 150 including the memory device 150 and the controller 130 described with reference to FIGS. 1 to 9 in accordance with the embodiment of the present invention is applied will now be described in detail.

Figure 10:
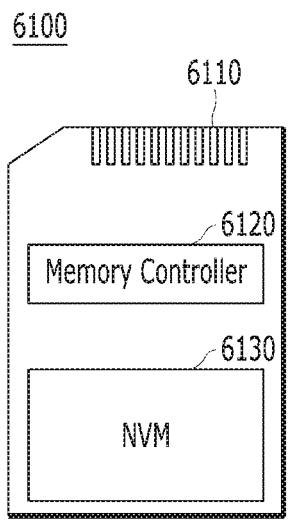
FIGS. 10 to 18 are diagrams schematically illustrating application examples of the data processing system in accordance with various embodiments of the present invention.

FIG. 10 is a diagram schematically illustrating the data processing system including the memory system in accordance with an embodiment. FIG. 10 schematically illustrates a memory card system to which the memory system in accordance with an embodiment is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile is memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by any of various nonvolatile memory devices such as an erasable and programmable ROM (EPROM) an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS), FIG. 11 is a diagram schematically illustrating another example of the data processing system including the memory system in accordance with an embodiment.

Figure 11:
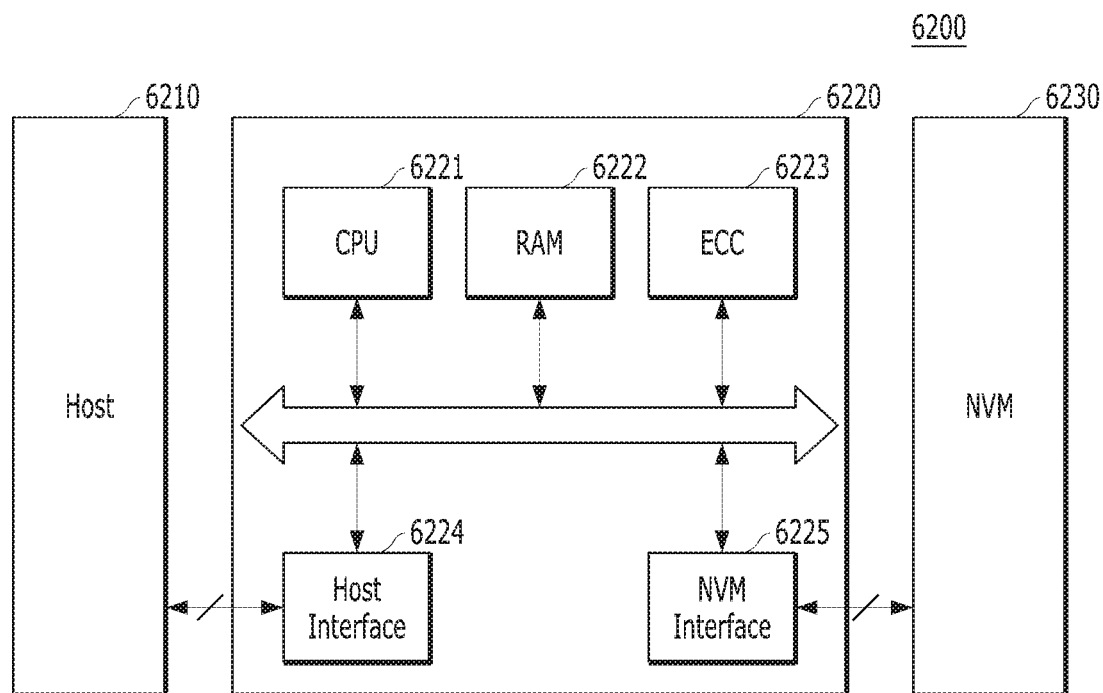

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 12:
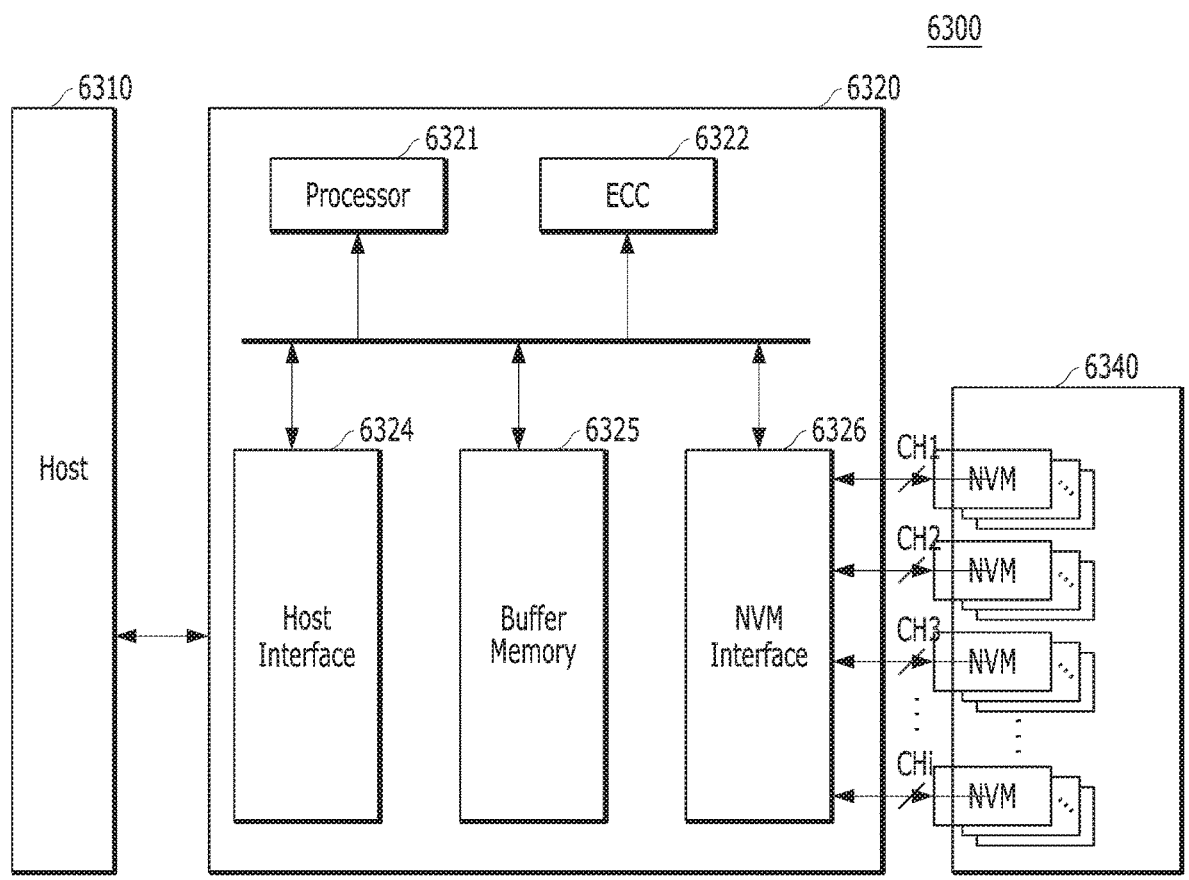

FIG. 12 is a diagram schematically illustrating another example of the data processing system including the memory system in accordance with an embodiment. FIG. 12 schematically illustrates an SSD to which the memory system may be applied.

Referring to FIG. 12, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a is memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 12 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data is processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
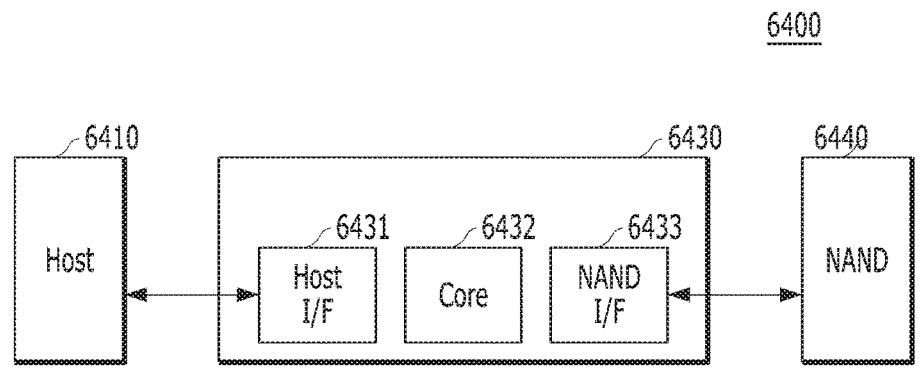

FIG. 13 is a diagram schematically illustrating another example of the data processing system including the memory system in accordance with an embodiment. FIG. 13 schematically illustrates an embedded Multi-Media Card (eMMC) to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1, Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with one or more embodiments. FIGS. 14 to 17 schematically illustrate UFS (Universal Flash Storage) systems to which the memory system may be applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
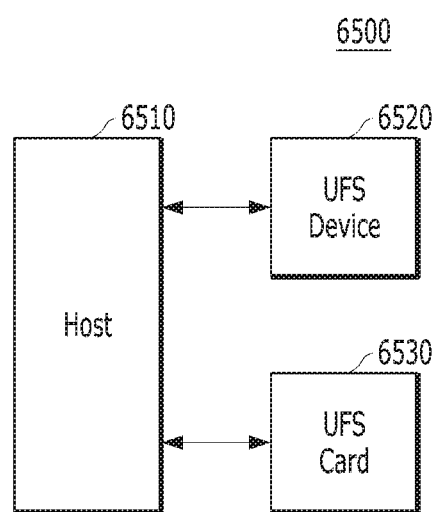

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
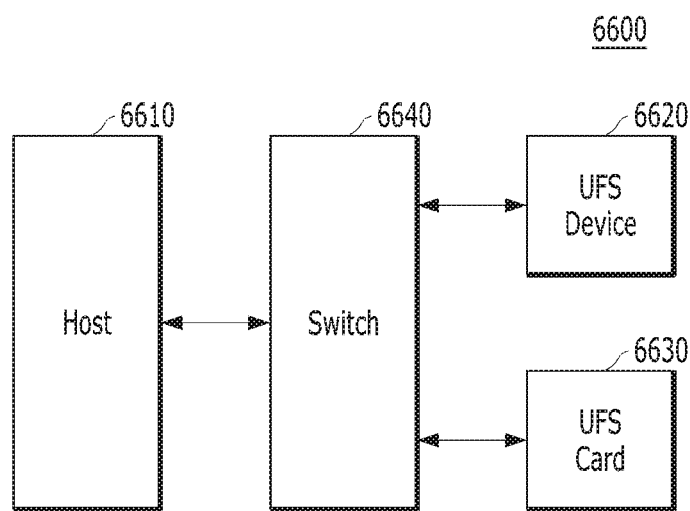

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
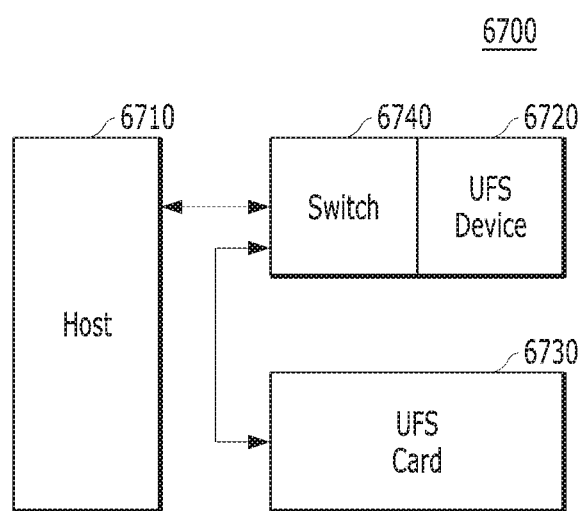

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
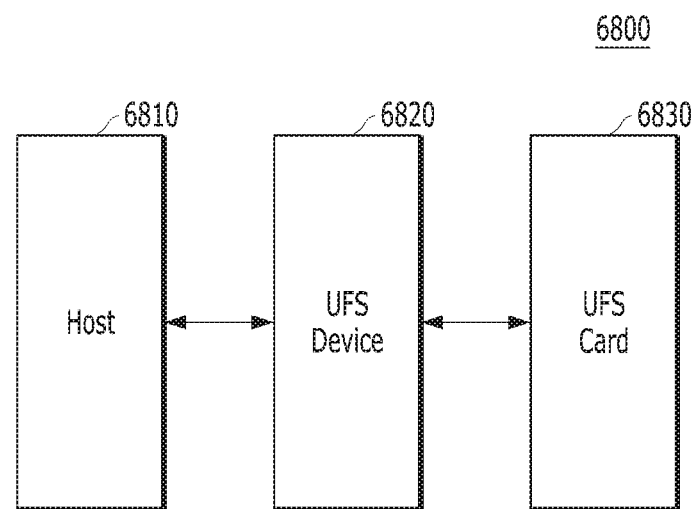

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
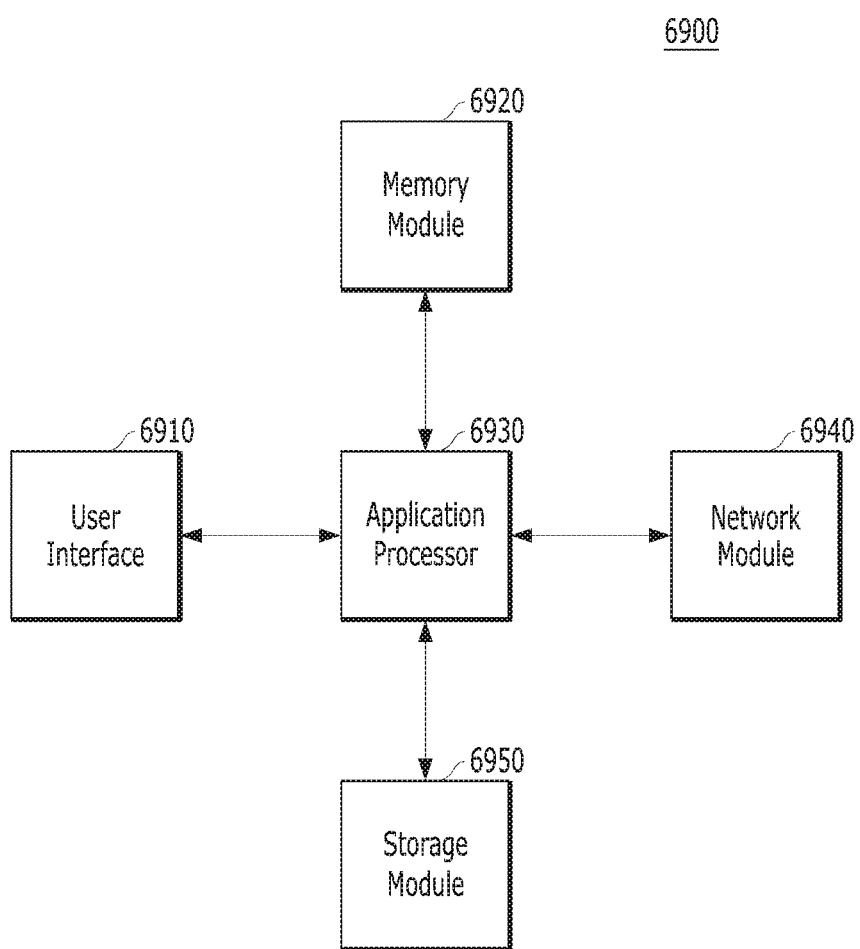

FIG. 18 is a diagram schematically illustrating another example of the data processing system including the memory system in accordance with an embodiment. FIG. 18 is a diagram schematically illustrating a user system to which the memory system may be applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application is processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1, is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiments of the present invention, the performance and reliability of a memory system may be improved by reflecting the state of a memory device and performing a read reclaim operation.

While the present invention has been described with respect to the specific embodiments, it will be apparent to those skilled in the art that various changes and modifications may be made without departing from the spirit and scope of the invention as defined in the following claims.

What is claimed is:

1. A method for operating a controller that controls a memory device including a memory block formed of a plurality of pages, the method comprising:
    calculating a read disturbance count for each of neighboring pages of a target page in the memory block based on the number of times that a test read operation is performed on the target page;
    calculating a read count for each of the neighboring pages based on the read disturbance count during a read operation on the target page; and
    controlling the memory device to perform a read reclaim operation based on the read counts of the pages in the memory block, and
    wherein the calculating of the read disturbance count includes:
    calculating a threshold read count for each of the neighboring pages, which is a number of times of the test read operations when uncorrectable errors occur in read data of the neighboring page;
    calculating a read disturbance value for each of the neighboring pages by dividing a trigger count, which is a read count to trigger the read reclaim operation, by the threshold read count of each of the neighboring pages; and
    setting a value obtained by multiplying the read disturbance value by a default increment as the read disturbance count.

2. The method of claim 1, wherein the calculating of the read disturbance count includes:
    calculating a threshold read count for each of the neighboring pages, which is a number of times of the test read operations when uncorrectable errors occur in read data of the neighboring page;
    calculating a read disturbance value for each of the neighboring pages by dividing the trigger count, which is a read count to trigger the read reclaim operation, by the threshold read count of each of the neighboring pages; and
    setting a value obtained by reflecting a predetermined weight to the read disturbance value as the read disturbance count.

3. The method of claim 2, wherein the predetermined weight corresponds to temperature or position of the neighboring page.

4. The method of claim 1, wherein the calculating of the threshold read count includes obtaining the number of times of the test read operations when the uncorrectable errors occur as a result of an error correction operation performed on the read data.

5. The method of claim 1, wherein the calculating of the read disturbance count is performed according to page offsets of the neighboring pages from the target page.

6. The method of claim 1,
    wherein the memory device includes a plurality of memory block groups including the memory block, each of which includes a predetermined number of memory blocks, and
    wherein the calculating of the read disturbance count is performed with reference to each of the memory block groups.

7. A controller for controlling a memory device that includes a memory block formed of a plurality of pages, the controller comprising:
    a memory; and
    a processor configured to calculate a threshold read count for each of the neighboring pages, which is a number of times of test operations when uncorrectable errors occur in data of neighboring page, calculate a read disturbance value for each of the neighboring pages by dividing a trigger count, which is a read count to trigger the read claim operation, by the threshold read count of each of the neighboring pages, and store a value obtained by reflecting a predetermined weight to the read disturbance value as a read disturbance count into the memory, and
    wherein the processor calculates a read count for each of the neighboring pages based on the read disturbance count stored in the memory during a read operation to the target page,
    wherein the processor controls the memory device to perform a read reclaim operation based on the read counts of the pages in the memory block.

8. The controller of claim 7, wherein the processor calculates the read disturbance count by:
    calculating a threshold read count for each of the neighboring pages, which is a number of times of the test read operations when uncorrectable errors occur in read data of the neighboring page;
    calculating a read disturbance value for each of the neighboring pages by dividing the trigger count, which is a read count to trigger the read reclaim operation, by the threshold read count of each of the neighboring pages; and setting a value obtained by reflecting a predetermined weight to the read disturbance value as the read disturbance count.

9. The controller of claim 8, wherein the predetermined weight corresponds to temperature or position of the neighboring page.

10. The controller of claim 7, wherein the processor calculates the threshold read count by obtaining the number of times of the test read operations when the uncorrectable errors occur as a result of an error correction operation performed on the read data.

11. The controller of claim 7, wherein the processor calculates the read disturbance count according to page offsets of the neighboring pages from the target page.

12. The controller of claim 7,
wherein the memory device includes a plurality of memory block groups including the memory block, each of which includes a predetermined number of memory blocks, and
wherein the processor calculates the read disturbance count with reference to each of the memory block groups.

13. A memory system comprising:
a memory device having a memory block including a plurality of pages;

a controller configured to:
control the memory device to perform a read operation on a target page in the memory block;
obtain read disturbance counts of respective neighboring pages of the target page based on a table having a relationship between the read disturbance count and a page offset in the memory block;
obtain read counts of the neighboring pages by accumulating the read disturbance counts to the read counts of the neighboring pages; and
control the memory device to perform a read reclaim operation to the memory block based on read counts of the pages in the memory block,
wherein the table is predetermined through repeated test read operations on a reference page in the memory block, and
wherein the read disturbance count in the table is obtained by dividing a read reclaim trigger count of the memory block, which is a read count to trigger the read reclaim operation, by a threshold read count of a page having the page offset from the reference page in the memory block to produce a read disturbance value, which is a number of times of read operations when uncorrectable errors occur in data of neighboring page, and multiplying the read disturbance value by a default increment as the read disturbance count.

* * * * *